United States Patent [19]

Ushida et al.

[11] Patent Number: 5,329,189

[45] Date of Patent: Jul. 12, 1994

[54] MIXER CIRCUIT

[75] Inventors: Susumu Ushida; Sadao Igarashi, both of Souma, Japan

[73] Assignee: Alps Electric Co., Ltd., Tokyo, Japan

[21] Appl. No.: 916,798

[22] Filed: Jul. 17, 1992

Related U.S. Application Data

[63] Continuation of Ser. No. 679,456, Apr. 2, 1991, abandoned.

[30] Foreign Application Priority Data

May 10, 1990 [JP] Japan .................................. 2-120976

[51] Int. Cl.$^5$ .......................... G06G 7/00; H03B 19/00
[52] U.S. Cl. .................................. 307/529; 307/494; 328/156; 330/254
[58] Field of Search ............... 307/254, 255, 494, 529, 307/493, 498; 328/15, 156, 215; 330/254; 358/27

[56] References Cited

U.S. PATENT DOCUMENTS

| | | | |
|---|---|---|---|
| 4,308,471 | 12/1981 | Misawa | 307/492 |
| 4,560,947 | 12/1985 | Frey | 330/254 |
| 4,614,911 | 9/1986 | Kawano | 307/498 |
| 4,792,992 | 12/1988 | Rinderle | 455/239 |
| 4,833,340 | 5/1989 | Deguchi | 307/494 |
| 4,931,746 | 6/1990 | Tränkle et al. | 307/529 |

FOREIGN PATENT DOCUMENTS

0171653A2 2/1986 European Pat. Off. .

Primary Examiner—Timothy P. Callahan
Assistant Examiner—Toan Tran
Attorney, Agent, or Firm—Guy W. Shoup; Patrick T. Bever

[57] ABSTRACT

A mixer circuit which is improved in distortion characteristic and band characteristic and can assure impedance matching with another circuit at a preceding stage readily and besides can prevent abnormal oscillations. The mixer circuit comprises a differential amplifier constituted from a pair of transistors grounded at the emitters thereof, and a double balanced mixer constituted from first and second pairs of transistors. A first impedance element is interposed between a junction between the emitters of the first pair of transistors of the double balanced mixer and the collector of one of the pair of transistors of the differential amplifier, and a second impedance element is interposed between a junction between the emitters of the second pair of transistors of the double balanced mixer and the collector of the other of the pair of transistors of the differential amplifier.

2 Claims, 1 Drawing Sheet

5,329,189

MIXER CIRCUIT

This application is a continuation of application Ser. No. 07/679,456, filed Apr. 2, 1991, now abandoned.

BACKGROUND OF THE INVENTION

1. Field of the Invention

This invention relates to a mixer circuit for use with a high frequency appliance such as a television tuner or a cable television converter.

2. Description of Related Art

Mixer circuits are conventionally known and employed widely in various high frequency appliances. An exemplary one of such conventional mixer circuits is shown in FIG. 2. Referring to FIG. 2, the conventional mixer circuit shown employs an emitter-coupled amplifier circuit and includes a double balanced mixer constituted from transistors $Q_1$ to $Q_4$ and a differential amplifier constituted from transistors $Q_5$ and $Q_6$.

The double balanced mixer is constituted from a differential circuit of the grounded-base type wherein the emitters of the transistors $Q_1$ and $Q_2$ are connected commonly by way of a common emitter terminal 1 and another differential circuit of the grounded-base type wherein the emitters of the transistors $Q_3$ and $Q_4$ are connected commonly by way of another common emitter terminal 2, and the bases of the transistors $Q_1$ and $Q_4$ are connected to an input terminal A of the double balanced mixer while the bases of the transistors $Q_2$ and $Q_3$ are connected to another input terminal B of the double balanced mixer. A local oscillation signal is supplied to the input terminals A and B of the double balanced mixer. Meanwhile, the collectors of the transistors $Q_1$ and $Q_3$ are connected to a common collector terminal C while the collectors of the transistors $Q_2$ and $Q_4$ are connected to another common collector terminal D, and a power terminal Vcc is connected to the common collector terminals C and D by way of impedance terminals $R_1$ and $R_2$, respectively, while output terminals G and H of the double balanced mixer are connected to the common collector terminals C and D.

On the other hand, the differential amplifier is constituted such that the bases of the transistors $Q_5$ and $Q_6$ are connected to a pair of input terminals E and F of the differential amplifier, respectively, while a pair of impedance elements $R_3$ and $R_4$ connected in series are connected between the emitters of the transistors $Q_5$ and $Q_6$, and a junction between the impedance elements $R_3$ and $R_4$ is grounded by way of a current source I.

With such construction, if a high frequency signal is supplied to the input terminals E and F of the differential amplifier by way of a band-pass filter (BPF), then it is amplified by the differential amplifier constituted from the transistors $Q_5$ and $Q_6$, and the thus amplified high frequency signal is outputted from the collectors of the transistors $Q_5$ and $Q_6$. The signal outputted from the collector of the transistor $Q_5$ is supplied to the common emitter terminal 1 of the double balanced mixer while the signal outputted from the collector of the transistor $Q_6$ is supplied to the other common emitter terminal 2 of the double balanced mixer. Then, as a local oscillation signal is inputted to the input terminals A and B, a mixed signal of the high frequency signal and the local oscillation signal is produced the double balanced mixer due to its non-linear operation and outputted from the double balanced mixer by way the output terminals G and H.

The conventional mixer circuit described above has such drawbacks as follows. In particular, while the differential circuits constituted from the transistors $Q_1$ and $Q_2$ and the transistors $Q_3$ and $Q_4$ and constituting the double balanced mixer are of the grounded-base type, generally a differential circuit of such grounded-based type is very low in input impedance, and accordingly, the load impedance of the differential amplifier to which the differential circuits are connected as a load is very low. Consequently, the differential amplifier does not have a desirable distortion characteristic, and deterioration in distortion characteristic such as cross modulation or intermodulation of the entire mixer circuit cannot be eliminate. This is apparent from simulation by non-linear software (microwave harmonica) of the Compact Company of the United States.

Further, while a high frequency signal is inputted to the differential amplifier by way of a band-pass filter, since the load impedance of the differential amplifier is extremely low, the input impedance of the differential amplifier presents a negative resistance and serves as a load to the band-pass filter. Accordingly, such problem takes place that the flatness in the band of the band-pass filter is deteriorated or the band width is reduced, and particularly since recent transistors are high in gain band width product Ft, this problem appears remarkably.

Furthermore, since the input impedance of the differential amplifier presents a negative resistance as described above, it is difficult to assure impedance matching between the differential amplifier and the band-pass filter, and if, for example, a resistor is added in order to eliminate the negative resistance, then another new problem takes place that the transmission loss is increased and the NF (noise figure) is deteriorated.

In addition, since the load impedance of the differential amplifier is low, the transistors $Q_5$ and $Q_6$ form an oscillator of the grounded-collector type. Accordingly, abnormal oscillations are likely produced.

SUMMARY OF THE INVENTION

It is an object of the present invention to provide a mixer circuit which is improved in distortion characteristic and band characteristic and can assure impedance matching with another circuit at a preceding stage readily and besides can prevent abnormal oscillations.

In order to attain the object, according to the present invention, there is provided a mixer circuit which comprises a differential amplifier constituted from a pair of transistors grounded at the emitters thereof, a double balanced mixer constituted from first and second pairs of transistors, a first impedance element interposed between a junction between the emitters of the first pair of transistors of the double balanced mixer and the collector of one of the pair of transistors of the differential amplifier, and a second impedance element interposed between a junction between the emitters of the second pair of transistors of the double balanced mixer and the collector of the other of the pair of transistors of the differential amplifier.

With the mixer circuit, the load impedance of each of the transistors of the differential amplifier is increased by the first or second impedance element. Consequently, the distortion characteristic and band characteristic of the entire mixer circuit are improved, and accordingly, impedance matching with a circuit at a preceding stage can be assured readily and abnormal oscillations are prevented.

The above and other objects, features and advantages of the present invention will become apparent from the following description and the appended claims, taken in conjunction with the accompanying drawings.

DETAILED DESCRIPTION OF THE PREFERRED EMBODIMENT

Figure 1:
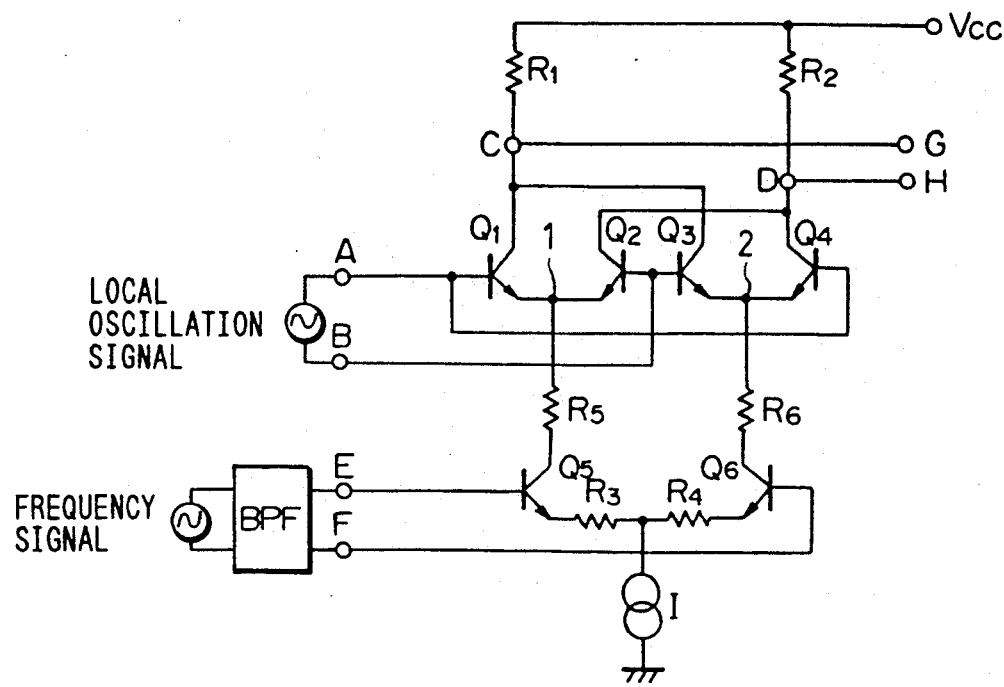
FIG. 1 is a circuit diagram of a mixer circuit showing a preferred embodiment of the present invention.

Referring to FIG. 1, there is shown a mixer circuit according to a preferred embodiment of the present invention. The mixer circuit shown has generally common construction to the conventional mixer circuit described hereinabove with reference to FIG. 2. Thus, in FIG. 1, like parts or elements are denoted by like reference characters to those of FIG. 2 and overlapping description thereof is omitted herein to avoid redundancy.

Figure 2:
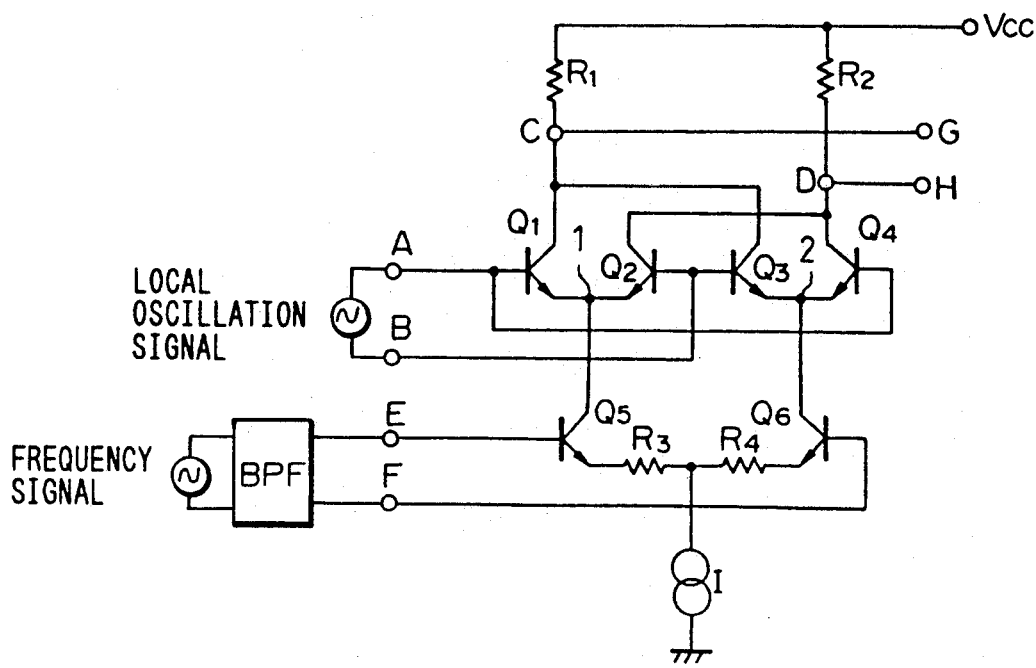
FIG. 2 is a circuit diagram showing a conventional mixer circuit.

In particular, the mixer circuit shown in FIG. 1 includes a pair of impedance elements $R_5$ and $R_5$ in addition to all of the components of the conventional mixer circuit shown in FIG. 2. The impedance element $R_5$ may be a resistor and is connected between the common emitter terminal 1 to which the emitters of the transistors $Q_1$ and $Q_2$ constituting one of the pair of differential circuits of the double balanced mixer are connected commonly and the collector of the transistor $Q_5$ of the differential amplifier at the preceding stage, and the other impedance element $R_6$ may be a resistor and is connected similarly between the other common emitter terminal 2 to which the transistors $Q_3$ and $Q_4$ constituting the other differential circuit of the double balanced mixer are connected commonly and the collector of the transistor $Q_6$ of the differential amplifier at the preceding stage.

With the mixer circuit of the construction, if a high frequency signal is supplied to the input terminals E and F of the differential amplifier by way of a band-pass filter BPF, then it is amplified by the differential amplifier constituted from the transistors $Q_5$ and $Q_6$, and the thus amplified frequency signal is outputted from the collectors of the transistors $Q_5$ and $Q_6$. The signal outputted from the collector of the transistor $Q_5$ is supplied to the common emitter terminal 1 of the double balanced mixer by way of the impedance element $R_5$ while the signal outputted from the collector of the transistor $Q_6$ is supplied to the common emitter terminal 2 of the double balanced mixer by way of the other impedance element $R_6$. Then, as a local oscillation signal is inputted to the input terminals A and B of the double balanced mixer, a mixed signal of the high frequency signal and the local oscillation signal is produced from the double balanced mixer due to its non-linear operation and outputted from the double balanced mixer, that is, the mixer circuit, by way of the output terminals G and H.

In this instance, since the impedance elements $R_5$ and $R_6$ are interposed respectively between the collectors of the transistors $Q_5$ and $Q_6$ of the differential amplifier and the common emitter terminals 1 and 2 of the transistors $Q_1$ and $Q_2$ and the transistors $Q_3$ and $Q_4$ which constitute the double balanced mixer, the load impedance of the differential amplifier is high comparing with that in a conventional mixer circuit. Accordingly, voltage distortion of the differential amplifier is improved and the distortion characteristic of the entire mixer circuit is improved. This is apparent from simulation by non-linear software (microwave harmonica) of the Compact Company of the United States.

Meanwhile, since the load impedance of the differential amplifier is adjusted to an appropriate value by the impedance elements $R_5$ and $R_6$, the input impedance of the differential amplifier does not present a negative resistance, and consequently, the band characteristic of a band-pass filter provided at the preceding stage to the differential amplifier is improved. Besides, impedance matching between the differential amplifier and such band-pass filter can be assured readily, and the matching loss can be decreased. As a result, the NF (noise figure) is improved, and abnormal oscillations of the differential amplifier at the former stage are prevented.

Having now fully described the invention, it will be apparent to one of ordinary skill in the art that many changes and modifications can be made thereto without departing from the spirit and scope of the invention as set forth herein.

What is claimed is:

1. A mixer circuit, comprising:
   a differential amplifier comprising a pair of transistors, each transistor of said pair of transistors comprising a collector;
   a double balanced mixer comprising a first pair of transistors and a second pair of transistors, each transistor of said first and second pairs of transistors comprising an emitter;
   a first impedance element interposed between a junction between the emitters of said first pair of transistors of said double balanced mixer and the collector of one of said pair of transistors of said differential amplifier; and
   a second impedance element interposed between a junction between the emitters of said second pair of transistors of said double balanced mixer and the collector of the other of said pair of transistors of said differential amplifier.

2. A mixer circuit according to claim 1, wherein each of said first and second impedance elements is a resistor.

* * * * *